United States Patent
Kim et al.

(10) Patent No.: US 8,514,644 B2
(45) Date of Patent: Aug. 20, 2013

(54) BIT LINE SENSE AMPLIFIER CONTROL CIRCUIT AND SEMICONDUCTOR MEMORY APPARATUS HAVING THE SAME

(75) Inventors: Hyung Soo Kim, Icheon-si (KR); Ki Myung Kyung, Icheon-si (KR); Ic Su Oh, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 279 days.

(21) Appl. No.: 12/959,590

(22) Filed: Dec. 3, 2010

(65) Prior Publication Data

US 2011/0292750 A1 Dec. 1, 2011

(30) Foreign Application Priority Data

May 31, 2010 (KR) .................. 10-2010-0051302

(51) Int. Cl.
*G11C 7/02* (2006.01)
(52) U.S. Cl.
USPC ........................................ 365/207
(58) Field of Classification Search
USPC ........................................ 365/207
See application file for complete search history.

(56) References Cited

U.S. PATENT DOCUMENTS

| | | | |
|---|---|---|---|
| 6,157,578 A | 12/2000 | Brady | |
| 6,973,002 B2 * | 12/2005 | Hara et al. | 365/205 |
| 7,002,862 B2 * | 2/2006 | Kang | 365/205 |
| 7,020,043 B1 * | 3/2006 | Lee | 365/230.06 |
| 7,599,238 B2 | 10/2009 | Cho | |
| 7,760,563 B2 * | 7/2010 | Park | 365/194 |
| 2004/0240291 A1 * | 12/2004 | Kang | 365/205 |
| 2009/0116303 A1 * | 5/2009 | Kim | 365/189.07 |
| 2009/0161448 A1 * | 6/2009 | Lee | 365/189.07 |

FOREIGN PATENT DOCUMENTS

| | | |
|---|---|---|
| JP | 2000-268590 | 9/2000 |
| JP | 2003-051188 | 2/2003 |
| KR | 1020020025501 A | 4/2002 |
| KR | 1020100048612 A | 5/2010 |
| KR | 1020100083587 A | 7/2010 |

\* cited by examiner

*Primary Examiner* — Hoai V Ho
*Assistant Examiner* — Pablo Huerta
(74) *Attorney, Agent, or Firm* — William Park & Associates Patent Ltd.

(57) ABSTRACT

A bit line sense amplifier control circuit is configured to drive a bit line sense amplifier according to a first sense amplifier enable signal and a second sense amplifier enable signal, wherein the driving force of the bit line sense amplifier is changed in response to a column selection control signal.

19 Claims, 5 Drawing Sheets

105

110

US 8,514,644 B2

BIT LINE SENSE AMPLIFIER CONTROL CIRCUIT AND SEMICONDUCTOR MEMORY APPARATUS HAVING THE SAME

CROSS-REFERENCES TO RELATED APPLICATION

The present application claims priority under 35 U.S.C. §119(a) to Korean application number 10-2010-0051302, filed on May 31, 2010, in the Korean Intellectual Property Office, which is incorporated herein by reference in its entirety as set forth in full.

BACKGROUND

1. Technical Field

The present invention relates to a semiconductor integrated circuit, and more particularly, to a bit line sense amplifier control circuit and a semiconductor memory apparatus having the same.

2. Related Art

In a semiconductor memory apparatus, specifically, a DRAM, when reading information of a memory cell or writing information to the memory cell, in order to sufficiently amplify a signal of data to be read or written, a bit line sense amplifier is used.

FIG. 1 is a configuration diagram illustrating a known bit line sense amplifier and control circuit therefor.

A bit line sense amplifier 10 may be configured in a type of a latch which is connected between a bit line pair BL and BLB. The bit line sense amplifier 10 amplifies a difference of the voltage levels of the bit line pair BL and BLB by using, as power sources, sense amplifier power signals RTO and SB outputted from a bit line sense amplifier control circuit 12.

The bit line sense amplifier control circuit 12 includes a sense amplifier driver 121 which is configured to generate the sense amplifier power signals RTO and SB in response to a first sense amplifier enable signal SAP and a second sense amplifier enable signal SAN.

The sense amplifier driver 121 includes a first driver P1 and a second driver N1. The first driver has a source terminal connected to a core voltage supply terminal VCORE, is driven by the first sense amplifier enable signal SAP and outputs the first sense amplifier power line signal RTO through a drain terminal. The second driver N1 has a source terminal connected to a ground terminal VSS, is driven by the second sense amplifier enable signal SAN and outputs the second sense amplifier power line signal SB through a drain terminal.

In a read operation for a memory cell, the data sensed by the bit line sense amplifier 10 should be transferred to a main amplifier (not shown). Here, since a load by a data line is substantial, latching capability of the bit line sense amplifier 10 should be strong so as not to lose the information sensed by the bit line sense amplifier 10. Also, in order to load information with sufficient charges on the data line, the driving force of the bit line sense amplifier 10 should be strong.

Conversely, in a write operation, if the latching capability of the bit line sense amplifier 10 increase, a duration of the write operation may increase. For example, data to write may have an opposite level to the data currently stored in the bit line sense amplifier 10. In this case, a toggling of a data level may take a longer time, and thus the duration of the write operation may increase.

As a result, a bit line sense amplifier, which has strong latching capability and driving force in a read operation and appropriate latching capability in a write operation, is demanded.

SUMMARY

In an exemplary embodiment of the present invention, a bit line sense amplifier control circuit is configured to drive a bit line sense amplifier according to a first sense amplifier enable signal and a second sense amplifier enable signal, wherein the driving force of the bit line sense amplifier is changed in response to a column selection control signal.

In another exemplary embodiment of the present invention, a bit line sense amplifier control circuit includes, a driving control signal generation unit configured to output first through fourth sense amplifier driving signals in response to sense amplifier enable signals and a column selection control signal, and a bit line sense amplifier driver configured to generate a first sense amplifier power line signal in response to the first and second sense amplifier driving signals and a second sense amplifier power line signal in response to the third and fourth sense amplifier driving signals.

In another exemplary embodiment of the present invention, a semiconductor memory apparatus includes a cell array having a plurality of memory cells which are connected between a plurality of word lines and a plurality of bit lines, a bit line sense amplifier connected to a bit line pair and configured to read data of the memory cells or write data to the memory cells, and a bit line sense amplifier control circuit configured to generate a first sense amplifier power line signal and a second sense amplifier power line signal of which the driving forces are determined in response to a column selection control signal and provide the generated first and second sense amplifier power line signals to the bit line sense amplifier.

In another exemplary embodiment of the present invention, a bit line sense amplifier control method includes discriminating an operation mode, enabling first and second sense amplifier driving signals for generating a first sense amplifier power line signal and third and fourth sense amplifier driving signals for generating a second sense amplifier power line signal, in a first operation mode, and enabling any one of the first and second sense amplifier driving signals for generating the first sense amplifier power line signal and any one of the third and fourth sense amplifier driving signals for generating the second sense amplifier power line signal, in a second operation mode.

In another exemplary embodiment of the present invention, a bit line sense amplifier control method includes generating first and second sense amplifier driving signals and third and fourth sense amplifier driving signals in response to first and second sense amplifier enable signals and a column selection control signal, and enabling any one of the first and second sense amplifier driving signals and any one of the third and fourth sense amplifier driving signals when the column selection control signal becomes a first level.

BRIEF DESCRIPTION OF THE DRAWINGS

Features, aspects, and exemplary embodiments are described in conjunction with the attached drawings, in which.

DETAILED DESCRIPTION

Hereinafter, a bit line sense amplifier control circuit and a semiconductor memory apparatus having the same according to the present invention will be described below with reference to the accompanying drawings through exemplary embodiments.

Figure 1:
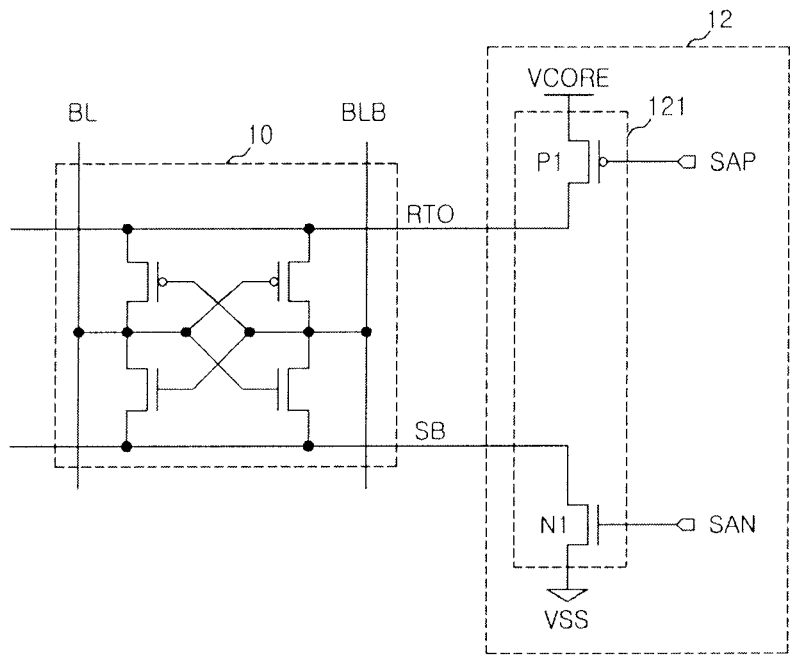
FIG. 1 is a configuration diagram illustrating a known bit line sense amplifier and control circuit therefor.
Figure 2:
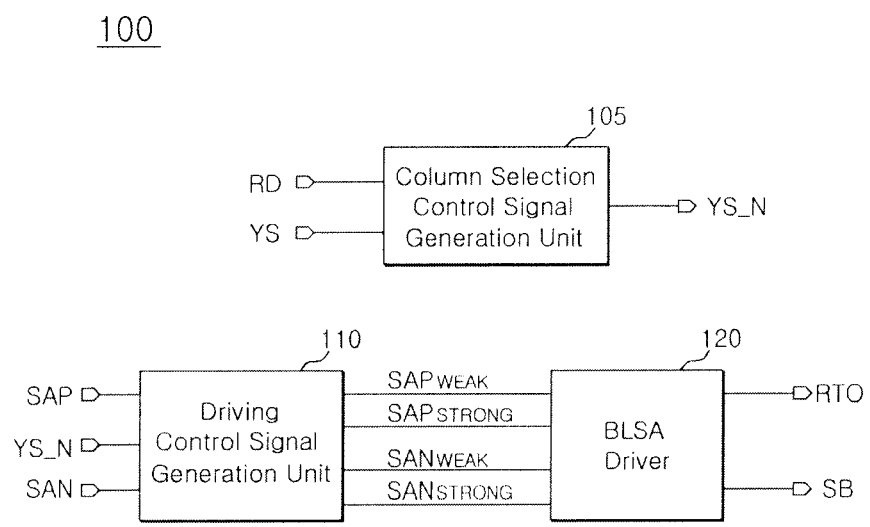
FIG. 2 is a configuration diagram illustrating a bit line sense amplifier control circuit in accordance with an exemplary embodiment of the present invention.

FIG. 2 is a configuration diagram illustrating a bit line sense amplifier control circuit in accordance with an exemplary embodiment of the present invention.

Referring to FIG. 2, a bit line sense amplifier control circuit 100 in accordance with an exemplary embodiment of the present invention includes a column selection control signal generation unit 105 configured to generate a column selection control signal YS_N in response to a read command RD and a column select signal YS, a driving control signal generation unit 110 configured to output first and second sense amplifier driving signals $SAP_{WEAK}$ and $SAP_{STRONG}$ and third and fourth sense amplifier driving signals $SAN_{WEAK}$ and $SAN_{STRONG}$ in response to sense amplifier enable signals SAP and SAN and the column selection control signal YS_N, and a bit line sense amplifier driver 120 configured to output sense amplifier power signals constituted by a first sense amplifier power line signal RTO and a second sense amplifier power line signal SB according to the first and second sense amplifier driving signals $SAP_{WEAK}$ and $SAP_{STRONG}$ and the third and fourth sense amplifier driving signals $SAN_{WEAK}$ and $SAN_{STRONG}$ generated by the driving control signal generation unit 110.

In detail, in a read operation, the column selection control signal YS_N is disabled, and the driving control signal generation unit 110 enables all of the sense amplifier driving signals $SAP_{WEAK}$, $SAP_{STRONG}$, $SAN_{WEAK}$ and $SAN_{STRONG}$. For example, the first and second sense amplifier driving signals $SAP_{WEAK}$ and $SAP_{STRONG}$ have logic "low" levels, and the third and fourth sense amplifier driving signals $SAN_{WEAK}$ and $SAN_{STRONG}$ have logic "high" levels. Accordingly, the bit line sense amplifier driver 120 generates the first sense amplifier power line signal RTO and the second sense amplifier power line signal SB with relatively strong driving force.

Conversely, in a write operation in which the column selection control signal YS_N is enabled, according to an example, only any one of the first and second sense amplifier driving signals $SAP_{WEAK}$ and $SAP_{STRONG}$, which are outputted from the driving control signal generation unit 110, and only any one of the third and fourth sense amplifier driving signals $SAN_{WEAK}$ and $SAN_{STRONG}$, which are outputted from the driving control signal generation unit 110, are enabled. Therefore, the bit line sense amplifier 120 has relatively small driving force.

Figure 3:
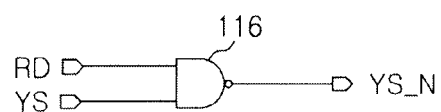
FIG. 3 is a diagram illustrating an exemplary embodiment of the column selection control signal generation unit shown in FIG. 2.

FIG. 3 is a diagram illustrating an exemplary embodiment of the column selection control signal generation unit shown in FIG. 2.

Referring to FIG. 3, the column selection control signal generation unit 105 may include a logic device 116, which causes the column selection control signal YS_N to disable, for example, have a low level in the read operation, and causes the column selection control signal YS_N to enable, for example, have a high level in the write operation, in response to the read command RD and the column select signal YS. The logic device 116 may include a NAND gate.

Figure 4:
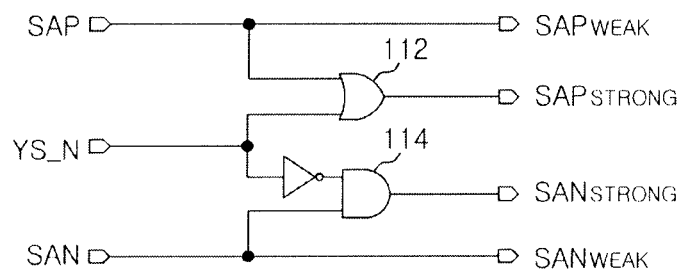
FIG. 4 is a diagram illustrating an exemplary embodiment of the driving control signal generation unit shown in FIG. 2.

FIG. 4 is a diagram illustrating an exemplary embodiment of the driving control signal generation unit shown in FIG. 2.

Referring to FIG. 4, the driving control signal generation unit 110 outputs the first sense amplifier enable signal SAP as the first sense amplifier driving signal $SAP_{WEAK}$ and the second sense amplifier enable signal SAN as the third sense amplifier driving signal $SAN_{WEAK}$.

According to the exemplary embodiment of the present invention, the driving control signal generation unit 110 includes a first logic device 112 configured to generate the second sense amplifier driving signal $SAP_{STRONG}$ in response to the first sense amplifier enable signal SAP and the column selection control signal YS_N. Also, the driving control signal generation unit 110 includes a second logic device 114 configured to generate the fourth sense amplifier driving signal $SAN_{STRONG}$ in response to the second sense amplifier enable signal SAN and an inverted signal of the column selection control signal YS_N.

In the exemplary embodiment of the invention, the first logic device 112 may include an OR gate. In this case, when a bit line sense amplifier performs the read operation, that is, the column selection control signal YS_N has the low level, the second sense amplifier driving signal $SAP_{STRONG}$ is enable to the low level. Conversely, when the bit line sense amplifier performs the write operation, that is, the column selection control signal YS_N has the high level, and the second sense amplifier driving signal $SAP_{STRONG}$ outputted from the first logic device 112 is disable to the high level.

The second logic device 114 may include an AND gate. In the read operation of the bit line sense amplifier, the inverted signal of the column selection control signal YS_N has the high level, and accordingly, the fourth sense amplifier driving signal $SAN_{STRONG}$ has the high level. Conversely, in the write operation of the bit line sense amplifier, the inverted signal of the column selection control signal YS_N has the low level, and accordingly, the fourth sense amplifier driving signal $SAN_{STRONG}$ has the low level.

Figure 5:
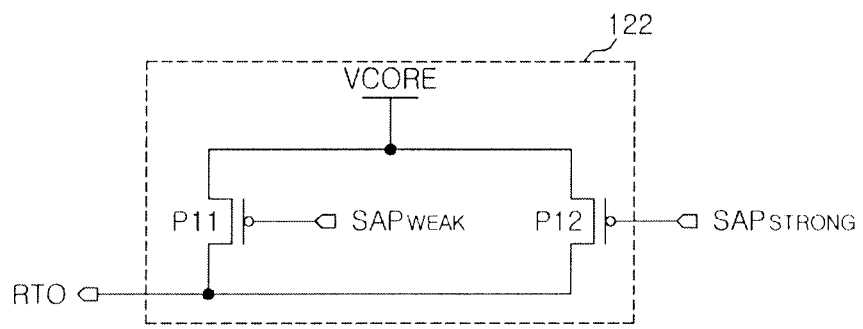
FIG. 5 is a diagram illustrating an exemplary embodiment of the bit line sense amplifier driver shown in FIG. 2.
Figure 5:
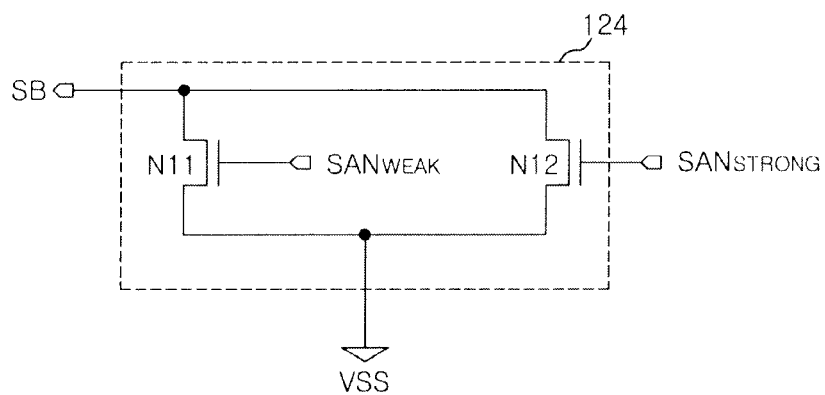

FIG. 5 is a diagram illustrating an exemplary embodiment of the bit line sense amplifier driver shown in FIG. 2.

Referring to FIG. 5, the bit line sense amplifier driver 120 includes a first driver 122 and a second diver 124. The first driver 122 is driven according to the first sense amplifier driving signal $SAP_{WEAK}$ and the second sense amplifier driving signal $SAP_{STRONG}$, and outputs a core voltage VCORE as the first sense amplifier power line signal RTO. The second driver 124 is driven according to the third sense amplifier driving signal $SAN_{WEAK}$ and the fourth sense amplifier driving signal $SAN_{STRONG}$ and outputs a ground voltage VSS as the second sense amplifier power line signal SB. While a voltage supplied to the first driver 122 is exemplified as the core voltage VCORE in the exemplary embodiment of present embodiment, the invention is not limited to such, and an external voltage such as a power supply voltage VDD may be applied. Similarly, while it is exemplified that the ground voltage VSS is applied to the second driver 124, the invention is not limited to such, and it is conceivable that a negative voltage or a substrate bias voltage may be applied.

In detail, according to the exemplary embodiment of the invention, the first driver 122 includes a first switching element P11 which has a source terminal connected to the core voltage supply terminal VCORE and a drain terminal connected to an output terminal of the first sense amplifier power line signal RTO, and is driven by the first sense amplifier driving signal $SAP_{WEAK}$. Also, the first driver 122 includes second switching element P12 which has a source terminal connected to the core voltage supply terminal VCORE and a drain terminal connected to the output terminal of the first sense amplifier power line signal RTO and is driven by the second sense amplifier driving signal $SAP_{STRONG}$.

Further, the second driver 124 includes a third switching element N11 which has a source terminal connected to the ground terminal VSS and a drain terminal connected to an output terminal of the second sense amplifier power line signal SB and is driven by the third sense amplifier driving signal $SAN_{WEAK}$. Also, the second driver 124 includes a fourth switching element N12 which has a source terminal connected to the ground terminal VSS and a drain terminal connected to the output terminal of the second sense amplifier power line signal SB and is driven by the fourth sense amplifier driving signal $SAN_{STRONG}$.

Accordingly, in the read operation of the bit line sense amplifier, that is, when the first sense amplifier enable signal SAP shown in FIG. 4 is enabled to a low level, the second sense amplifier enable signal SAN is enabled to a high level and the column selection control signal YS_N has the low level, both the first sense amplifier driving signal $SAP_{WEAK}$ and the second sense amplifier driving signal $SAP_{STRONG}$ become low levels, and the first and second switching elements P11 and P12 shown in FIG. 5 are turned on. Moreover, as both the third sense amplifier driving signal $SAN_{WEAK}$ and the fourth sense amplifier driving signal $SAN_{STRONG}$ become high levels, the third and fourth switching elements N11 and N12 shown in FIG. 5 are all turned on. As a consequence, the bit line sense amplifier driver 120 operates with strong driving force and can supply the first sense amplifier power line signal RTO and the second sense amplifier power line signal SB with the strong driving force.

Conversely, in the write operation of the bit line sense amplifier, the column selection control signal YS_N becomes the high level. Therefore, as the first sense amplifier driving signal $SAP_{WEAK}$ becomes the low level and the second sense amplifier driving signal $SAP_{STRONG}$ becomes the high level, according to this example, only the first switching element P11 shown in FIG. 5 is turned on. Further, as the third sense amplifier driving signal $SAN_{WEAK}$ becomes the high level and the fourth sense amplifier driving signal $SAN_{STRONG}$ becomes the low level, according to this example, only the third switching element N11 is turned on. Hence, driving force for supplying the first sense amplifier power line signal RTO and the second sense amplifier power line signal SB becomes weak compared to the read operation.

As a result, the bit line sense amplifier has strong latching capability in the read operation, and the latching capability becomes weak in the write operation so that data of the bit line sense amplifier can be changed within a short time in the case where data to be written has an opposite level.

Figure 6:
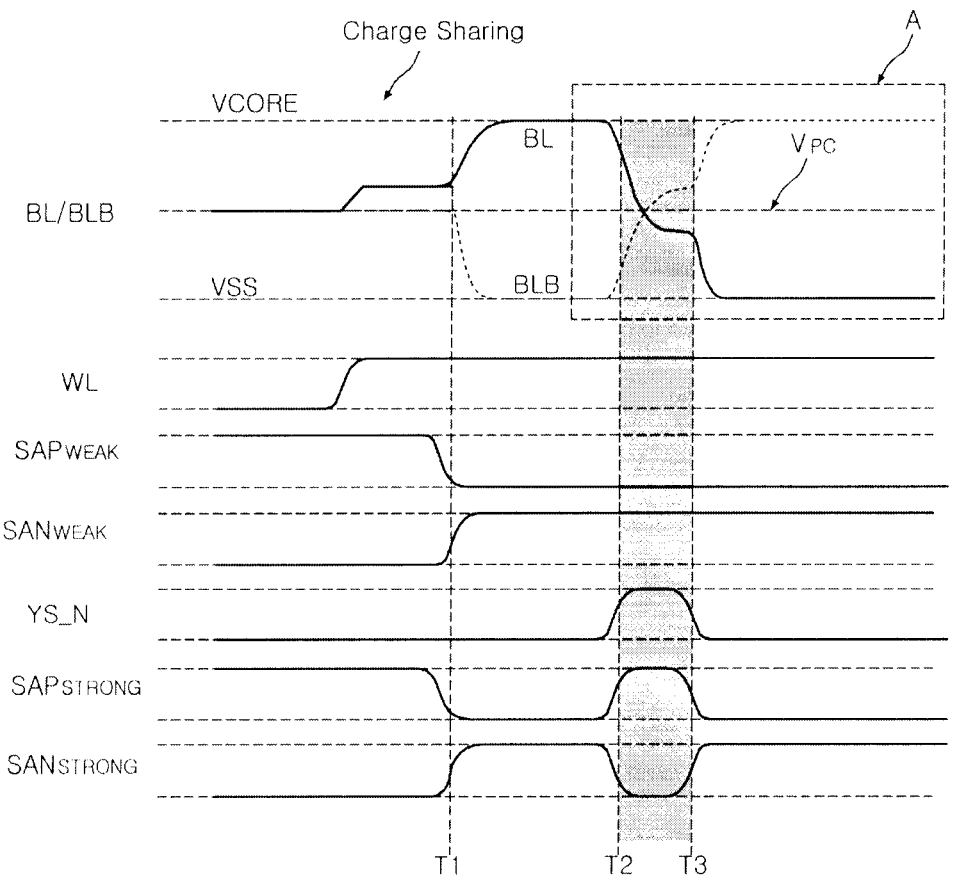
FIG. 6 is a timing diagram for explaining read and write operations using the bit line sense amplifier control circuit in accordance with the exemplary embodiment of the present invention.

FIG. 6 is a timing diagram for explaining read and write operations using the bit line sense amplifier control circuit in accordance with the exemplary embodiment of the present invention.

Before the read or write operation is started, a bit line pair BL and BLB has a precharge voltage $V_{PC}$. As the read command RD is enabled, if a bit line equalize signal (not shown) is disabled and a word line select signal WL is enabled, charge sharing of the bit line pair BL and BLB begins.

For a bit line sensing operation, a voltage difference between the bit line pair BL and BLB become amplified. To this end, the column selection control signal YS_N has the low level, and the first and second sense amplifier enable signals SAP and SAN are enabled to the low level and the high level, respectively. As a consequence, at a first timing T1, the first and second sense amplifier driving signals $SAP_{WEAK}$ and $SAP_{STRONG}$ outputted from the driving control signal generation unit 110 are enabled to the low levels, and the third and fourth sense amplifier driving signals $SAN_{WEAK}$ and $SAN_{STRONG}$ are enabled to the high levels, and thus the bit line sense amplifier stores data with strong latching capability.

After the bit line sensing operation is completed, as the read command RD is disabled and the column selection control signal YS_N becomes the high level at a second timing T2, the data to be written may be amplified and stored in the bit line sense amplifier. Here, the first sense amplifier driving signal $SAP_{WEAK}$ outputted from the driving control signal generation unit 110 is enabled to the low level, and the second sense amplifier driving signal $SAP_{STRONG}$ is disabled to the high level. Further, the third sense amplifier driving signal $SAN_{WEAK}$ is enabled to the high level, and the fourth sense amplifier driving signal $SAN_{STRONG}$ is disabled to the low level.

According to this example, this state is maintained until the column selection control signal YS_N becomes the low level at a third timing T3, and an amount of charges, depending upon the data to be written, is charged to the bit line pair BL and BLB.

In the case where data of, for example, a high level is stored in the bit line sense amplifier before writing a new data, and the new date to be stored is a low level, the level of the bit line pair BL and BLB should be inverted.

Since it takes a long time to invert the data as the latching capability of the bit line sense amplifier is strong, in the present embodiment of the invention, the sense amplifier driving signals are enabled depending upon a mode such that the levels of the sense amplifier power signals RTO and SB outputted from the sense amplifier driver can be controlled. Accordingly, in the write operation, as the latching capability of the bit line sense amplifier becomes weak, a time required to toggle data can be significantly shortened as in the case where it is necessary to store data with a level opposite to that of previous data.

Figure 7:
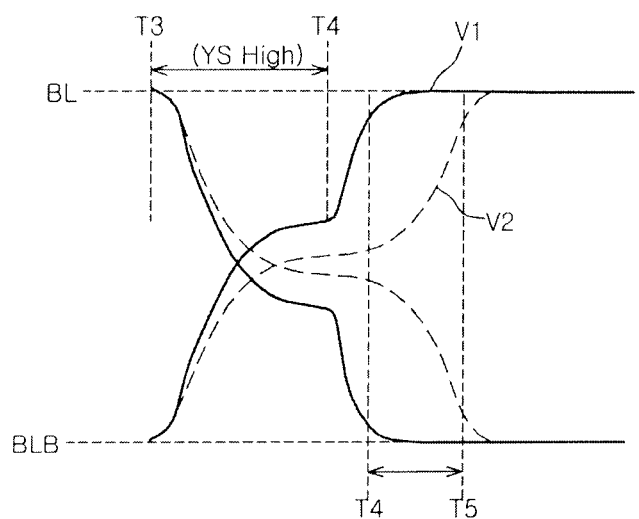
FIG. 7 is an enlarged timing diagram for explaining in detail a potential change of bit lines upon the write operation in the timing diagram shown in FIG. 6.

FIG. 7 is an enlarged timing diagram for explaining in detail a potential change of bit lines upon the write operation in the timing diagram shown in FIG. 6.

FIG. 7 is a timing diagram obtained by enlarging the part A of FIG. 6. The dotted line indicates a change of potential V2 in the bit line pair BL and BLB during the write operation of the known bit line sense amplifier, and the solid line indicates a change of potential V1 in the bit line pair BL and BLB during the write operation of the bit line sense amplifier controlled by the bit line sense amplifier control circuit in accordance with the exemplary embodiment of the present invention.

If the potential of the bit line pair BL and BLB is swung by approximately 90%, a potential of a level opposite to a previous level may be supplied to the bit line pair BL and BLB.

In the case of the known bit line sense amplifier, since it has the same latching capability in a write mode as in a read mode, a relatively long time may be required to invert the level of the potential applied to the bit line pair BL and BLB. Unlike this, in the exemplary embodiment of the present invention, the level of the potential applied to the bit line pair BL and BLB can be changed in a relatively short time.

As a result, a time for desired data to be loaded on the bit line pair BL and BLB can be shortened by T5-T4.

The bit line sense amplifier may be controlled in the following ways by using the bit line sense amplifier control circuit configured as mentioned above. That is to say, when the bit line sense amplifier is in a first operation mode as a result of discriminating an operation mode, the first and second sense amplifier driving signals for generating the first sense amplifier power line signal and the third and fourth sense amplifier driving signals for generating the second sense amplifier power line signal are all enabled. Such a first operation mode may be a read mode.

When the bit line sense amplifier is in a second operation mode as a result of discriminating an operation mode, any one of the first and second sense amplifier driving signals for generating the first sense amplifier power line signal and any one of the third and fourth sense amplifier driving signals for generating the second sense amplifier power line signal are enabled. Such a second operation mode may be a write mode.

Otherwise, the bit line sense amplifier may be controlled through a step of generating the first and second sense amplifier driving signals and the third and fourth sense amplifier driving signals in response to the first and second sense amplifier enable signals and the column selection control signal, and a step of enabling any one of the first and second sense amplifier driving signals and any one of the third and fourth sense amplifier driving signals when the column selection control signal become a first level, for example, the high level.

Figure 8:
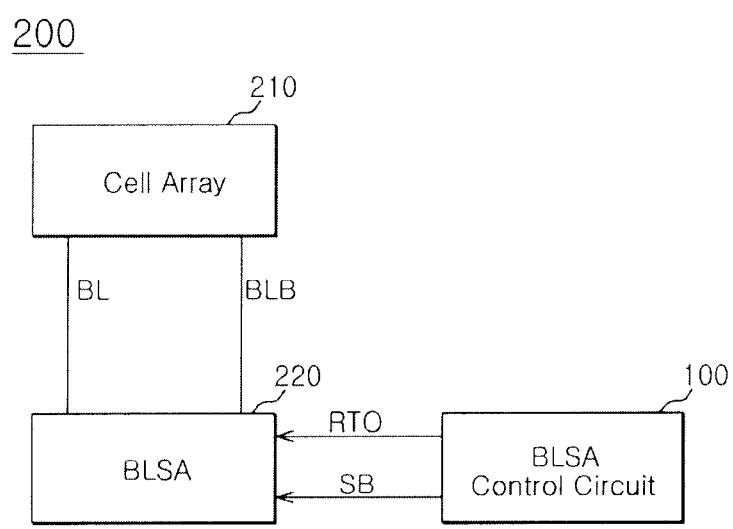
FIG. 8 is a configuration diagram illustrating a semiconductor memory apparatus in accordance with another exemplary embodiment of the present invention.

FIG. 8 is a configuration diagram illustrating a semiconductor memory apparatus in accordance with another exemplary embodiment of the present invention.

A semiconductor memory apparatus 200 in accordance with another exemplary embodiment of the present invention includes a cell array 210 which includes a plurality of memory cells connected between word lines and bit lines, and a bit line sense amplifier (BLSA) 220 which is configured to write data to the memory cells of the cell array 210 or read data of the memory cells of the cell array 210.

The semiconductor memory apparatus 200 further includes a bit line sense amplifier control circuit 100 which is configured to supply a power to the bit line sense amplifier 220.

The bit line sense amplifier control circuit 100 may be configured, for example, as shown in FIG. 2. In other words, the bit line sense amplifier control circuit 100 may be configured in such a way as to generate the first through fourth sense amplifier driving signals $SAP_{WEAK}$, $SAP_{STRONG}$, $SAN_{WEAK}$ and $SAN_{STRONG}$ according to the first and second sense amplifier enable signals SAP and SAN and the column selection control signal YS_N, and change potential levels of the first sense amplifier power line signal RTO and the second sense amplifier power line signal SB depending upon an operation mode, that is, whether the column selection control signal YS_N is enabled or not, in the operation of the bit line sense amplifier 220.

In the case where the bit line sense amplifier control circuit 100 shown in FIG. 8 is configured as shown in FIG. 2, the column selection control signal generation unit 105, the driving control signal generation unit 110 and the bit line sense amplifier driver 120 may be configured as shown in FIGS. 3 through 5, respectively, while not being limited to such.

The cell array 210 may include a folded bit line structure or an open bit line structure.

While certain embodiments have been described above, it will be understood to those skilled in the art that the embodiments described are by way of example only. Accordingly, the bit line sense amplifier control circuit and the semiconductor memory apparatus having the same described herein should not be limited based on the described embodiments. Rather, the bit line sense amplifier control circuit and the semiconductor memory apparatus having the same described herein should only be limited in light of the claims that follow when taken in conjunction with the above description and accompanying drawings.

What is claimed is:

1. A bit line sense amplifier control circuit configured to drive a bit line sense amplifier according to a first sense amplifier enable signal and a second sense amplifier enable signal, wherein the driving force of the bit line sense amplifier is changed in response to a column selection control signal, wherein the bit line sense amplifier control circuit comprises:
a driving control signal generation unit configured to output first through fourth sense amplifier driving signals in response to the first and second sense amplifier enable signals and the column selection control signal.

2. The bit line sense amplifier control circuit according to claim 1, wherein the first sense amplifier enable signal is outputted as a first sense amplifier driving signal, a second sense amplifier driving signal is generated in response to the first sense amplifier enable signal and the column selection control signal, the second sense amplifier enable signal is outputted as a third sense amplifier driving signal, and a fourth sense amplifier driving signal is generated in response to the second sense amplifier enable signal and the column selection control signal.

3. The bit line sense amplifier control circuit according to claim 2, wherein, when the first sense amplifier enable signal and the second sense amplifier enable signal are enabled and the column selection control signal has a level of a read mode, the first through fourth sense amplifier driving signals are enabled.

4. The bit line sense amplifier control circuit according to claim 2, wherein, when the column selection control signal has a level of a write mode, any one of the first and second sense amplifier driving signals and any one of the third and fourth sense amplifier driving signals are disabled.

5. The bit line sense amplifier control circuit according to claim 1, wherein the column selection control signal is generated in response to a read command and a column select signal.

6. The bit line sense amplifier control circuit according to claim 1, wherein the bit line sense amplifier control circuit further comprises:
a bit line sense amplifier driver configured to generate a first sense amplifier power line signal in response to the first and second sense amplifier driving signals and a second sense amplifier power line signal in response to the third and fourth sense amplifier driving signals.

7. The bit line sense amplifier control circuit according to claim 6, wherein the bit line sense amplifier driver comprises:
a first driver configured to output a first sense amplifier power line signal according to the first and second sense amplifier driving signals; and
a second driver configured to output a second sense amplifier power line signal according to the third and fourth sense amplifier driving signals.

8. The bit line sense amplifier control circuit according to claim 7, wherein the first driver comprises:
   a first switching element connected between a power supply terminal and an output terminal of the first sense amplifier power line signal, wherein the first switching element is driven by the first sense amplifier driving signal; and
   a second switching element connected between the power supply terminal and the output terminal of the first sense amplifier power line signal, wherein the second switching element is driven by the second sense amplifier driving signal.

9. The bit line sense amplifier control circuit according to claim 7, wherein the second driver comprises:
   a third switching element connected between a ground terminal and an output terminal of the second sense amplifier power line signal, wherein the third switching element is driven by the third sense amplifier driving signal; and
   a fourth switching element connected between the ground terminal and the output terminal of the second sense amplifier power line signal, wherein the fourth switching element is driven by the fourth sense amplifier driving signal.

10. The bit line sense amplifier control circuit according to claim 6, further comprising:
   a column selection control signal generation unit configured to generate the column selection control signal in response to a read command and a column select signal.

11. A semiconductor memory apparatus comprising:
   a cell array having a plurality of memory cells which are connected between a plurality of word lines and a plurality of bit lines;
   a bit line sense amplifier connected to a bit line pair and configured to read data of the memory cells or write data to the memory cells; and
   a bit line sense amplifier control circuit configured to generate a first sense amplifier power line signal and a second sense amplifier power line signal of which the driving forces are determined in response to a column selection control signal, and provide the generated first and second sense amplifier power line signals to the bit line sense amplifier,
   wherein the bit line sense amplifier control circuit comprises:
   a driving control signal generation unit configured to output first through fourth sense amplifier driving signals in response to a first sense amplifier enable signal, a second sense amplifier enable signal and the column selection control signal.

12. The semiconductor memory apparatus according to claim 11, wherein the bit line sense amplifier control circuit further comprises:
   a bit line sense amplifier driver configured to generate the first sense amplifier power line signal in response to the first and second sense amplifier driving signals and the second sense amplifier power line signal in response to the third and fourth sense amplifier driving signals.

13. The semiconductor memory apparatus according to claim 12, wherein the bit line sense amplifier control circuit further comprises:
   a column selection control signal generation unit configured to generate the column selection control signal in response to a read command and a column select signal.

14. The semiconductor memory apparatus according to claim 11,
   wherein the driving control signal generation unit outputs the first sense amplifier enable signal as the first sense amplifier driving signal and the second sense amplifier enable signal as the third sense amplifier driving signal; and
   wherein the driving control signal generation unit comprises:
   a first logic device configured to output the second sense amplifier driving signal in response to the first sense amplifier enable signal and the column selection control signal; and
   a second logic device configured to output the fourth sense amplifier driving signal in response to the second sense amplifier enable signal and the column selection control signal.

15. The semiconductor memory apparatus according to claim 12, wherein the bit line sense amplifier driver comprises:
   a first driver configured to output a first sense amplifier power line signal according to the first and second sense amplifier driving signals; and
   a second driver configured to output a second sense amplifier power line signal according to the third and fourth sense amplifier driving signals.

16. The semiconductor memory apparatus according to claim 15, wherein the first driver comprises:
   a first switching element connected between a power supply terminal and an output terminal of the first sense amplifier power line signal, wherein the first switching element is driven by the first sense amplifier driving signal; and
   a second switching element connected between the power supply terminal and the output terminal of the first sense amplifier power line signal, wherein the second switching element is driven by the second sense amplifier driving signal.

17. The semiconductor memory apparatus according to claim 15, wherein the second driver comprises:
   a third switching element connected between a ground terminal and an output terminal of the second sense amplifier power line signal, wherein the third switching element is driven by the third sense amplifier driving signal; and
   a fourth switching element connected between the ground terminal and the output terminal of the second sense amplifier power line signal, wherein the fourth switching element is driven by the fourth sense amplifier driving signal.

18. A bit line sense amplifier control method comprising:
   discriminating an operation mode;
   enabling first and second sense amplifier driving signals for generating a first sense amplifier power line signal and third and fourth sense amplifier driving signals for generating a second sense amplifier power line signal, in a first operation mode; and
   enabling any one of the first and second sense amplifier driving signals for generating the first sense amplifier power line signal and any one of the third and fourth sense amplifier driving signals for generating the second sense amplifier power line signal, in a second operation mode.

19. The method according to claim 18, wherein the first mode is a read mode, and the second mode is a write mode.

* * * * *